United States Patent
Liu et al.

(10) Patent No.: US 10,547,439 B2
(45) Date of Patent: Jan. 28, 2020

(54) CLOCK DATA RECOVERY DEVICE

(71) Applicant: REALTEK SEMICONDUCTOR CORPORATION, Hsinchu (TW)

(72) Inventors: Jian Liu, Suzhou (CN); Chi-Kung Kuan, San Jose, CA (US)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/394,106

(22) Filed: Apr. 25, 2019

(65) Prior Publication Data
US 2019/0334693 A1    Oct. 31, 2019

(30) Foreign Application Priority Data

Apr. 27, 2018  (CN) .......................... 2018 1 0392559

(51) Int. Cl.
| | | |
|---|---|---|
| *H04L 7/033* | (2006.01) | |
| *H03L 7/08* | (2006.01) | |
| *H03L 7/099* | (2006.01) | |
| *H03L 7/087* | (2006.01) | |

(52) U.S. Cl.
CPC .......... *H04L 7/0331* (2013.01); *H03L 7/0807* (2013.01); *H03L 7/087* (2013.01); *H03L 7/099* (2013.01); *H04L 7/0332* (2013.01)

(58) Field of Classification Search
CPC ..... H04L 7/033; H04L 7/0332; H04L 7/0331; H03L 7/0807; H03L 7/087; H03L 7/0891; H03L 7/099; H03L 7/091; H03L 7/00
See application file for complete search history.

(56) References Cited

U.S. PATENT DOCUMENTS

| | | |
|---|---|---|
| 5,694,062 A | 12/1997 | Welch et al. |
| 7,139,347 B2 | 11/2006 | Fujita et al. |
| 7,342,521 B1 | 3/2008 | Liu |
| (Continued) | | |

FOREIGN PATENT DOCUMENTS

WO    WO03077465 A1    9/2003

OTHER PUBLICATIONS

OA letter of the counterpart TW application (appl. No. 107115485) dated Jul. 31, 2019. Summary of the OA letter: Claims 1, 3-7 are rejected as being unpatentable over the cited reference 1 (U.S. Pat. No. 9,209,966 B1) in view of the Applicant's addmitted prior art.

*Primary Examiner* — Khanh C Tran
(74) *Attorney, Agent, or Firm* — WPAT, PC

(57) ABSTRACT

Disclosed is a clock data recovery (CDR) device including a master lane circuit and a plurality of slave lane circuits. The master lane circuit includes: a clock multiplication unit including a phase frequency detector (PFD), a charge pump (CP), a voltage-controlled oscillator (VCO), and a loop divider; a master lane sampling circuit; a master lane phase detector (PD); and a master lane multiplexer coupled between the master lane PD and the CP and between the PFD and the CP. Each slave lane circuit includes: a slave lane sampling circuit (SLS); a slave lane PD; a slave lane digital loop filter; a phase rotator (PR); and a slave lane multiplexer coupled between the VCO and the SLS and between the PR and the SLS, in which the master lane multiplexer and the slave lane multiplexers are configured to have the CDR device operate in one of multiple modes.

20 Claims, 9 Drawing Sheets

(56) References Cited

U.S. PATENT DOCUMENTS

| | | | |
|---|---|---|---|
| 7,499,513 B1 * | 3/2009 | Tetzlaff | G06F 1/10 327/156 |
| 9,036,764 B1 * | 5/2015 | Hossain | H03L 7/087 375/355 |
| 9,209,966 B1 | 12/2015 | Hossain et al. | |
| 9,313,019 B2 | 4/2016 | Wu et al. | |
| 9,397,868 B1 * | 7/2016 | Hossain | H04L 25/03057 |
| 9,940,288 B1 * | 4/2018 | Reiss | G06F 13/4068 |
| 2007/0146014 A1 | 6/2007 | Cheung | |
| 2008/0218226 A1 | 9/2008 | Nagaraj | |
| 2019/0280849 A1 * | 9/2019 | Schuh | H04L 7/0087 |

* cited by examiner

CLOCK DATA RECOVERY DEVICE

BACKGROUND OF THE INVENTION

1. Field of the Invention

The present invention relates to a clock data recovery device, especially to a clock data recovery device capable of operating in one of multiple modes with a compact configuration.

2. Description of Related Art

The types of a conventional clock data recovery (CDR) device includes an analog CDR device, a digital CDR device and a combined CDR device composed of an analog CDR device and a digital CDR device. As shown in FIG. 1, a general analog CDR device 100 includes a data sampler (DS) 110, an edge sampler (ES) 120, a phase detector (PD) 130, a charge pump (CP) 140, a low pass filter (LPF) 150 and a voltage-controlled oscillator (VCO) 160 outputting an in-phase clock CM and a quadrature-phase clock CKQ to the data sampler 110 and the edge sampler 120 respectively. As shown in FIG. 2, a general digital CDR device 200 includes a data sampler 210, an edge sampler 220, a phase detector 230, a digital loop filter (DLF) 240, a phase rotator (PR) 250 and a clock multiplication unit (CMU) 260, in which the phase rotator 250 outputs an in-phase clock CM and a quadrature-phase clock CKQ to the data sampler 210 and the edge sampler 220 respectively and the CMU (a.k.a. phase-locked loop (PLL)) 260 includes a phase frequency detector, a charge pump, a low pass filter, a voltage-controlled oscillator and a loop divider. As shown in FIG. 3, a combined CDR device 300 includes components of the aforementioned analog CDR device 100 and the aforementioned digital CDR device 200, and further includes a multiplexer 310 configured to output the clock of the VCO 160 when the combined CDR device 300 functions as an analog CDR device and configured to output the clock of the phase rotator 250 when the combined CDR device 300 functions as a digital CDR device. Since the components of the aforementioned three kinds of CDR devices and the operation thereof are well known in this industrial field, the detail is omitted here.

Based on the above description, the combined CDR device 300 can be set to function as an analog CDR device or a digital CDR device for different applications or demands. However, the combined CDR device 300 not only includes the CP 140, the LPF 150 and the VCO 160 but also includes the CMU 260 which also includes a charge pump, a low pass filter and a voltage-controlled oscillator. Obviously, many circuits in the combined CDR device 300 are duplicate/similar, and this leads to the increase of circuit area and the waste of cost. In addition, regarding a multilane application, each lane needs a CDR circuit and if the CDR circuit of each lane is a combined CDR device capable of being set to function as an analog CDR device or a digital CDR device, the whole circuit area will be very large, which is unfavorable for circuit miniaturization and cost saving.

SUMMARY OF THE INVENTION

An object of the present invention is to provide a clock data recovery (CDR) device capable of preventing the problems of the prior art.

The present invention discloses a CDR device capable of operating in one of multiple modes with a compact configuration. An embodiment of the CDR device includes a master circuit and a plurality of slave lane circuits. The master lane circuit includes: a clock multiplication unit including a phase frequency detector, a charge pump, a low pass filter, a voltage-controlled oscillator and a loop divider; a master lane sampling circuit coupled to the voltage-controlled oscillator; a master lane phase detector coupled to the master lane sampling circuit; and a master lane multiplexer coupled between the master lane phase detector and the charge pump, and coupled between the phase frequency detector and the charge pump. Each of the slave lane circuits includes: a slave lane sampling circuit; a slave lane phase detector coupled to the slave lane sampling circuit and the master lane multiplexer; a slave lane digital loop filter coupled to the slave lane phase detector; a phase rotator coupled to the slave lane digital loop filter and the voltage-controlled oscillator; and a slave lane multiplexer coupled between the voltage-controlled oscillator and the slave lane sampling circuit, and coupled between the phase rotator and the slave lane sampling circuit. The master lane multiplexer and each of the slave lane multiplexers are configured to have the CDR device operate in one of the multiple modes.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present invention includes a clock data recovery device capable of operating in one of multiple modes with a compact configuration. Therefore, the present invention is favorable for circuit miniaturization and cost-saving.

Figure 1:
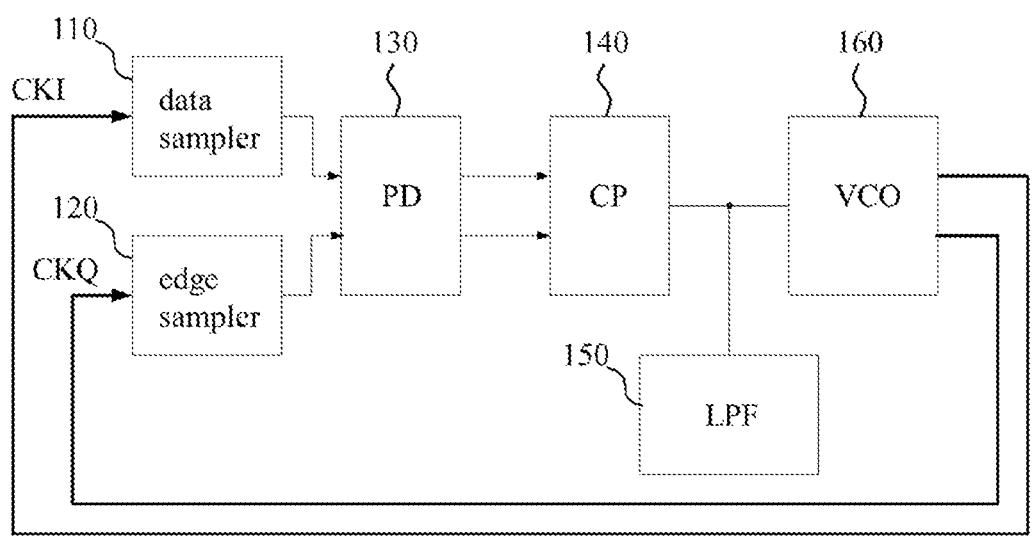
FIG. 1 shows a conventional analog clock data recovery device.
Figure 4:
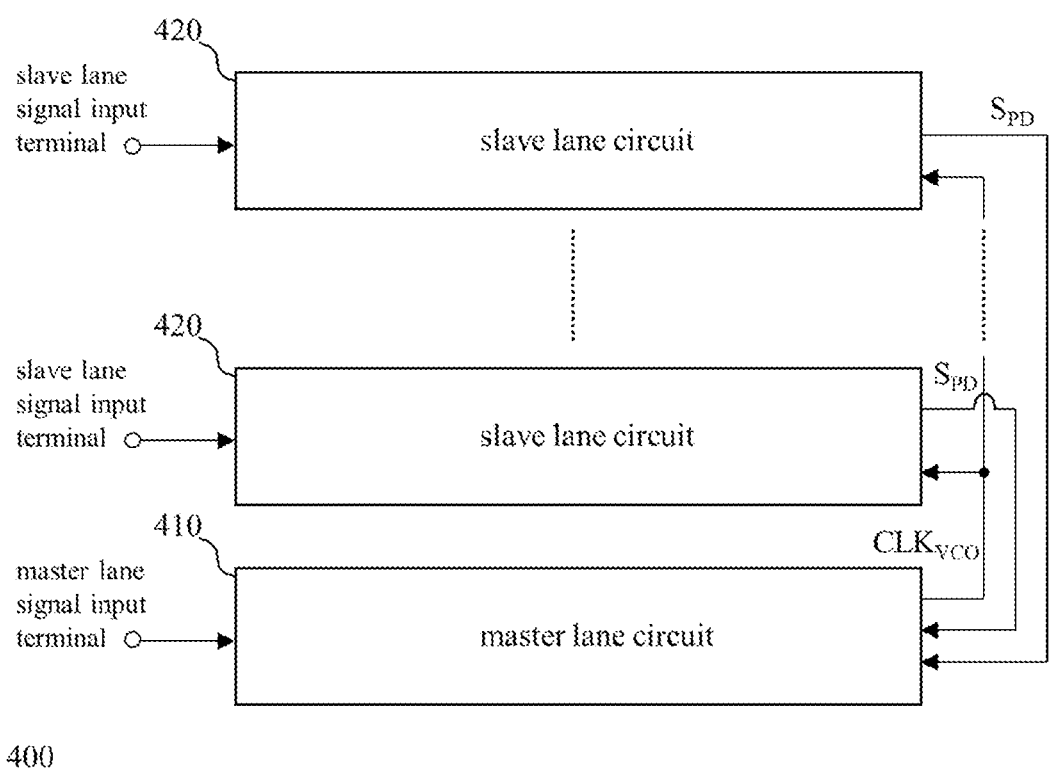
FIG. 4 shows an embodiment of the clock data recovery device of the present invention.
Figure 5:
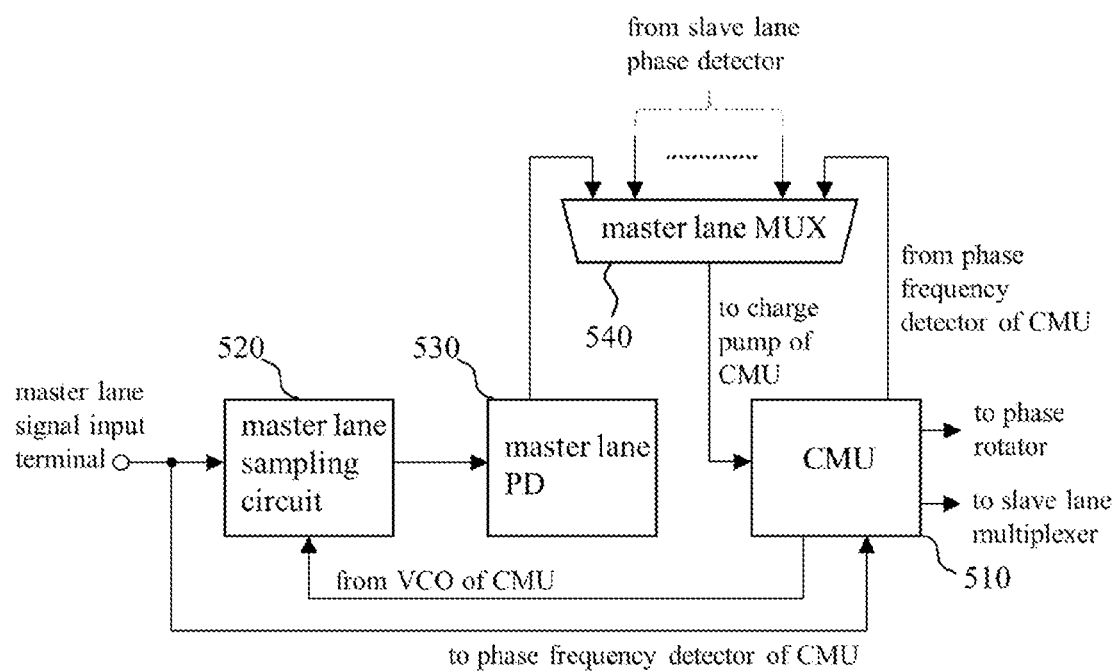
FIG. 5 shows an embodiment of the master lane circuit of FIG. 4.
Figure 6:
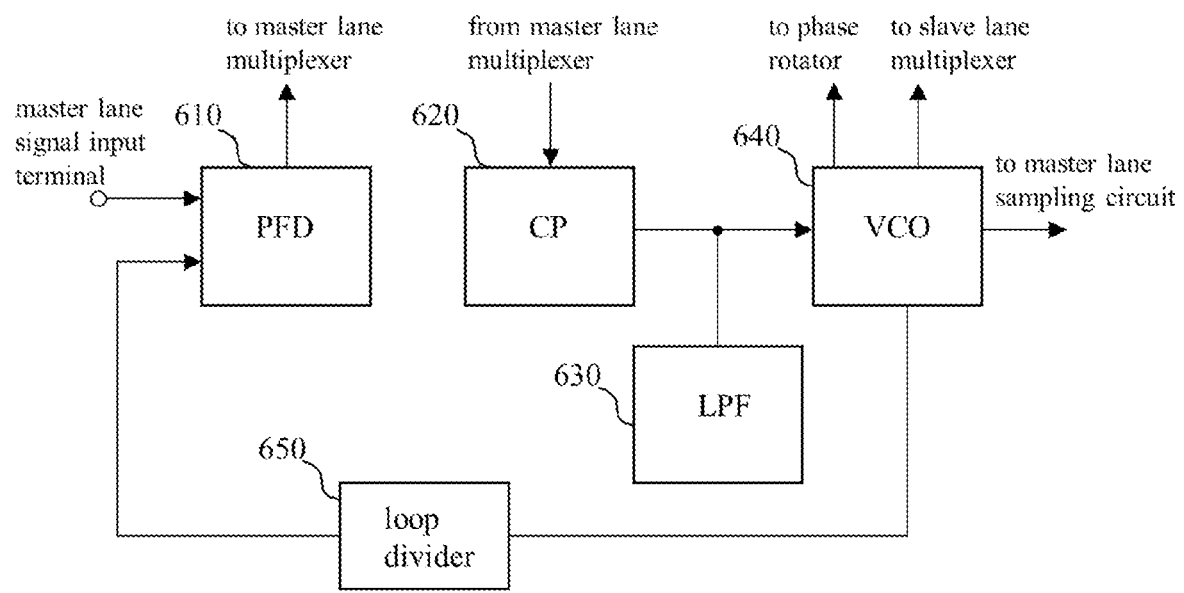
FIG. 6 shows an embodiment of the clock multiplication unit of FIG. 5.
Figure 7:
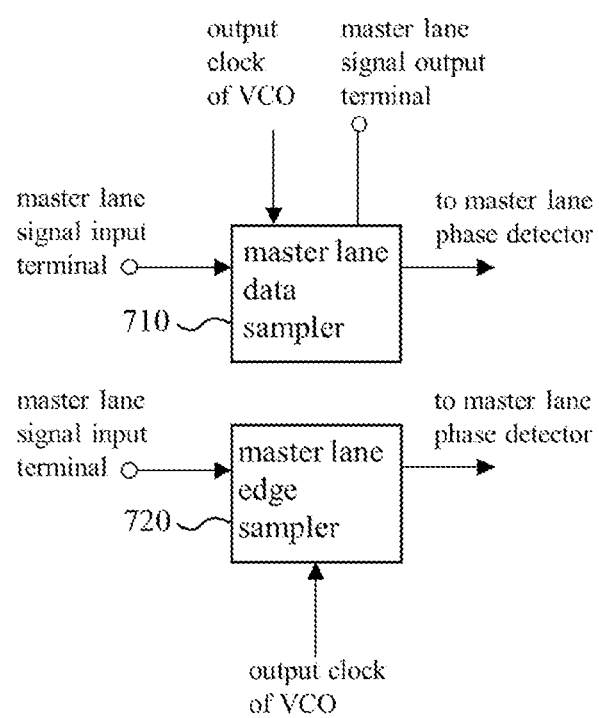
FIG. 7 shows an embodiment of the master lane sampling circuit of FIG. 5.

FIG. 4 shows an embodiment of the clock data recovery (CDR) device of the present invention. The CDR device 400 of FIG. 4 includes a master lane circuit 410 and a plurality of slave lane circuits 420 (e.g., three slave lane circuits 420), in which the master lane circuit 410 is coupled to a master lane signal input terminal and outputs an output clock $CLK_{VCO}$ to each slave lane circuit 420 (e.g., outputting the output clock $CLK_{VCO}$ to the phase rotator 840 and the slave lane multiplexer 850 of each slave lane circuit 420 of FIG. 8) while each slave lane circuit 420 is coupled to a slave lane signal input terminal and outputs a phase detection signal $S_{PD}$ (e.g., the phase detection signal outputted by the slave lane phase detector 820 of FIG. 8) to the master lane circuit 410. An embodiment of the master lane circuit 410 is shown in FIG. 5, including a clock multiplication unit (CMU) unit 510, a master lane sampling circuit (ML-SC) 520, a master lane phase detector (ML-PD) 530 and a master lane multiplexer (ML-MUX) 540, in which each of the CMU 510, the ML-SC 520, the ML-PD 530 and the ML-MUX 540 alone is a known or self-developed circuit. An embodiment of the CMU 510 is shown in FIG. 6, including a phase frequency detector (PFD) 610, a charge pump (CP) 620, a low pass filter (LPF) 630, a voltage-controlled oscillator (VCO) 640 and a loop divider (LD) 650, in which the PFD 610 is coupled to the aforementioned master lane signal input terminal and coupled to the CP 620 via the ML-MUX 540. The PFD 610 can receive a master lane signal (e.g., clock signal) from the master lane signal input terminal and treat the master lane signal as a reference signal so as to allow the CMU 510 to generate an output clock. In addition, each of the PFD 610, the CP 620, the LPF 630, the VCO 640 and the LD 650 alone is a known or self-developed circuit. An embodiment of the ML-SC 520 is shown in FIG. 7, including a master lane data sampler (ML-DS) 710 and a master lane edge sampler (ML-ES) 720. The ML-DS 710 and the ML-ES 720 are coupled to the master lane signal input terminal to receive the master lane signal; furthermore, the ML-DS 710 and the ML-ES 720 are coupled to the VCO 640 to receive the output clock of the VCO 640 (e.g., CKI and CKQ of FIG. 1; or a source clock for the generation of clocks including CKI and CKQ while the frequency of the source clock can optionally be different from the frequency of CM and CKQ) and carry out sample operation accordingly. The ML-DS 710 is further coupled to a master lane signal output terminal to output a sampled data signal. In addition, each of the ML-DS 710 and the ML-ES 720 alone is a known or self-developed circuit. The ML-PD 530 is coupled to the ML-SC 520 to generate a detection signal according to the result of the sample operation of the ML-DS 710 and the ML-ES 720 by simple logical calculation. The ML-MUX 540 is coupled between the ML-PD 530 and the CP 620 and coupled between the PFD 610 and the CP 620, and the ML-MUX 540 is set according to the operation mode of the CDR device 400 to establish appropriate electrical connection. The operation of the ML-MUX 540 is described in detail in a later paragraph. It should be noted that in accordance with a user demand (i.e., the operation mode of the CDR device 400 determined by a user), the setting of the ML-MUX 540 can be set once and kept permanently unchanged, or the setting of the ML-MUX 540 can be set adaptively and kept adjustable.

Figure 2:
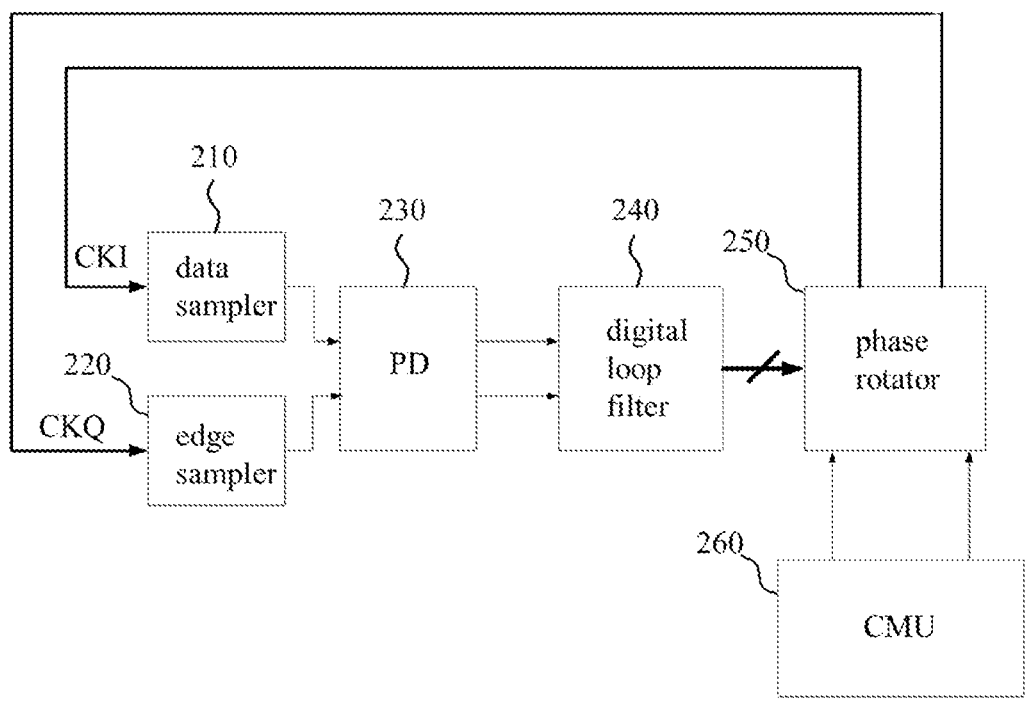
FIG. 2 shows a conventional digital clock data recovery device.
Figure 3:
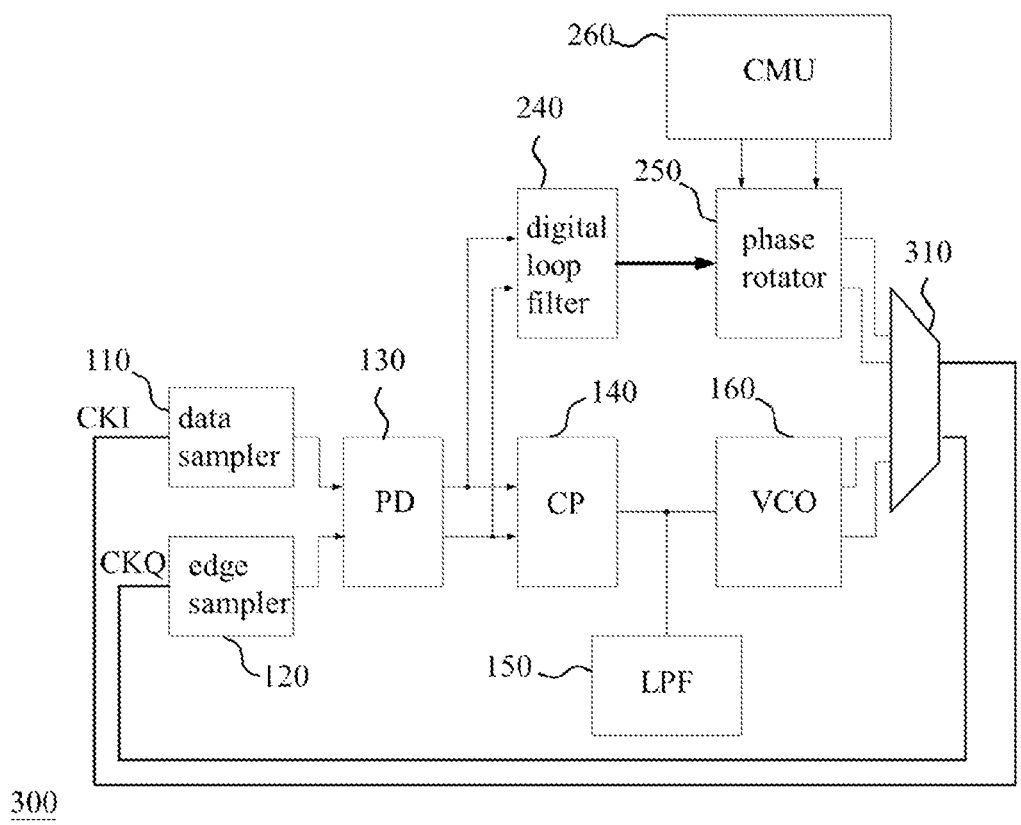
FIG. 3 shows a conventional combined clock data recovery device.
Figure 8:
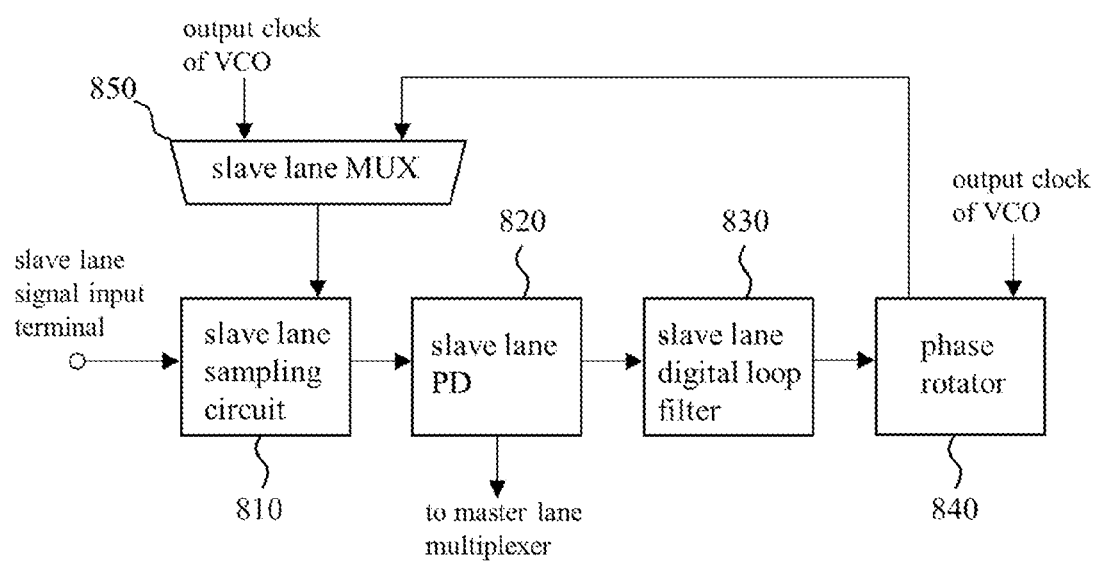
FIG. 8 shows an embodiment of each slave lane circuit of FIG. 4.
Figure 9:
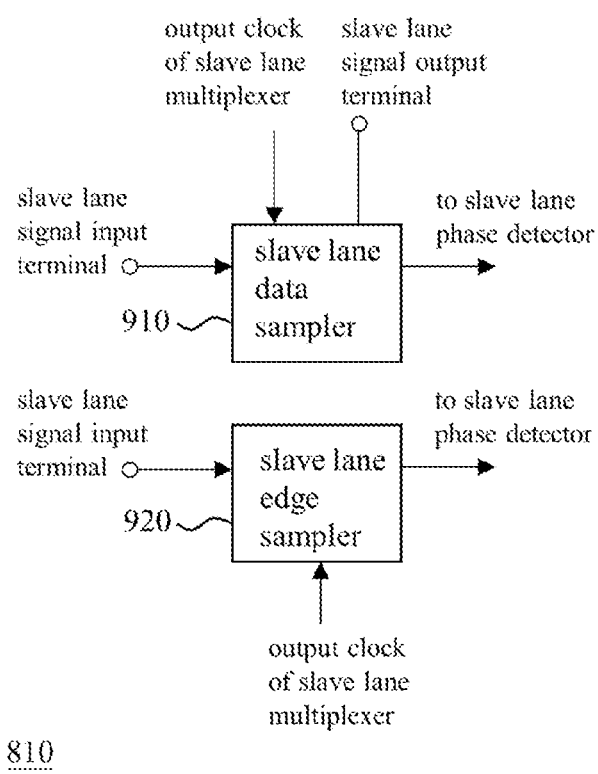
FIG. 9 shows an embodiment of the slave lane sampling circuit of FIG. 8.

An embodiment of each slave lane circuit 420 is shown in FIG. 8, including a slave lane sampling circuit (SL-SC) 810, a slave lane phase detector (SL-PD) 820, a slave lane digital loop filter (SL-DLF) 830, a phase rotator (PR) 840 and a slave lane multiplexer (SL-MUX) 850, in which each of the SL-SC 810, the SL-PD 820, the SL-DLF 830, the PR 840 and the SL-MUX 850 alone is a known or self-developed circuit. An embodiment of the SL-SC 810 is shown in FIG. 9, including a slave lane data sampler (SL-DS) 910 and a slave lane edge sampler (SL-ES) 920. Both the SL-DS 910 and the SL-ES 920 are coupled to the aforementioned slave lane signal input terminal and coupled to one of the PR 840 and the VCO 640 through SL-MUX 850 so as to carry out sample operation according to the output clock of the PR 840 (e.g., CKI and CKQ of FIG. 2) or the output clock of the VCO 640 (e.g., CKI and CKQ of FIG. 1; or a source clock for the generation of clocks including CKI and CKQ while the frequency of the source clock can optionally be different from the frequency of CKI and CKQ); furthermore, the SL-DS 910 is coupled to a slave lane signal output terminal to output a sampled data signal. In addition, each of the SL-DS 910 and the SL-ES 920 alone is a known or self-developed circuit. The SL-PD 820 is coupled to the SL-SC 810 and generates a detection signal according to the results of the sample operation of the SL-DS 910 and the SL-ES 920 by simple logical calculation, and thereby the SL-PD 820 outputs the detection signal to the SL-DLF 830 and the ML-MUX 540. The SL-DLF 830 is coupled to the SL-PD 820 and generates a phase selection signal according to the detection signal. The PR 840 is coupled to the VCO 640 and the SL-DLF 830 and generates a plurality of clocks having the same frequency but different phases according to the output clock of the VCO 640; the PR 840 further outputs one of the clocks to the SL-MUX 850 according to the phase selection signal of SL-DLF 830. The SL-MUX 850 is coupled between the VCO 640 and the SL-SC 810 and coupled between the PR 840 and the SL-SC 810, and the SL-MUX 850 is set according to the operation mode of the CDR device 400 to establish appropriate electrical connection. The operation of the SL-MUX 850 is described in detail in a later paragraph. It should be noted that in accordance with a user demand (i.e., the operation mode of the CDR device 400 determined by a user), the setting of the SL-MUX 850 can be set once and kept permanently unchanged, or the setting of the SL-MUX 850 can be set adaptively and kept adjustable.

An embodiment of the aforementioned multiple modes includes a first mode (e.g., a digital CDR mode applicable to High Definition Multimedia Interface (HDMI) protocol), a second mode (e.g., a hybrid CDR mode applicable to HDMI protocol), a third mode (e.g., an analog CDR mode applicable to a single lane (master lane) of DisplayPort protocol), a fourth mode (e.g., an analog CDR mode applicable to a single lane (slave lane) of DisplayPort protocol) and a fifth mode (e.g., a hybrid CDR mode applicable to two/four lanes of DisplayPort protocol).

When the CDR device 400 operates in the aforementioned first mode, the ML-MUX 540 electrically connects the PFD 610 and the CP 620, electrically disconnects the ML-PD 530 from the CP 620 and electrically disconnects each SL-PD 820 from the CP 620; in the meantime, the master lane circuit 410 functions as a CMU. To be more specific, the CMU 510 treats the aforementioned master lane signal (e.g., the clock signal from a clock lane of HDMI protocol) as a reference clock and thereby has the VCO 640 output a first mode output clock (e.g., a clock including an in-phase clock CKI and a quadrature-phase clock CKQ which have the same frequency and a phase difference (90 degree); or a source clock for the generation of clocks including CKI and CKQ while the frequency of the source clock can optionally be different from the frequency of CKI and CKQ) to the PR 840 of each slave lane circuit 420. When the CDR device 400 operates in the first mode, each slave lane circuit 420 functions as a digital CDR device, in which each SL-MUX 850 electrically connects the PR 840 and the SL-SC 810 and disconnects the VCO 640 from the SL-SC 810.

When the CDR device 400 operates in the aforementioned second mode, the ML-MUX 540 electrically connects a selected phase detector among the slave lane phase detectors 820 and the CP 620, electrically disconnects the SL-PD 820 of each of the slave lane circuit(s) 420 without including the selected phase detector from the CP 620, electrically disconnects the PFD 610 from the CP 620 and electrically disconnects the ML-PD 530 from the CP 620; in the meantime, the cooperation of the master lane circuit 410 and the slave lane circuit 420 including the selected phase detector is equivalent to the operation of an analog CDR device. To be more specific, the CP 620 generates a charge/discharge signal according to the output of the selected phase detector, the LPF 630 determines an input voltage according to the charge/discharge signal, and the VCO 640 generates a second mode output clock (e.g., a clock including an in-phase clock CKI and a quadrature-phase clock CKQ; or a source clock for the generation of clocks including CKI and CKQ while the frequency of the source clock can optionally be different from the frequency of CKI and CKQ) according to the input voltage and outputs the second mode output clock to the PR 840 of each slave lane circuit 420 without including the selected phase detector. When the CDR device 400 operates in the second mode, the SL-MUX 850 of the selected slave lane circuit (i.e., the slave lane circuit 420 including the selected phase detector) electrically connects the VCO 640 and the SL-SC 810 of the selected slave lane circuit 420 and electrically disconnects the SL-SC 810 of the selected slave lane circuit 420 from the PR 840 of the selected slave lane circuit 420 while the operation of each non-selected slave lane circuit 420 (i.e., each slave lane circuit 420 without including the selected phase detector) is equivalent to a digital CDR device and the SL-MUX 850 of each non-selected slave lane circuit 520 electrically connects the PR 840 and the SL-SC 810 and electrically disconnects the SL-SC 810 from the VCO 640.

When the CDR device 400 operates in the aforementioned third mode, the ML-MUX 540 electrically connects the ML-PD 530 and the CP 620, electrically disconnects each SL-PD 820 from the CP 620 and electrically disconnects the PFD 610 from the CP 620; in the meantime, the master lane circuit 410 functions as an analog CDR device. In the third mode, the operation of the slave lane circuits 420 can be ignored.

When the CDR device 400 operates in the aforementioned fourth mode, the ML-MUX 540 electrically connects a selected phase detector among the slave lane phase detectors 820 and the CP 620, electrically disconnects the slave lane phase detector 820 of each of the slave lane circuit(s) 420 without including the selected phase detector from the CP 620, electrically disconnects the PFD 610 from the CP 620 and electrically disconnects the ML-PD 530 from the CP 620; in the meantime, the cooperation of the master lane circuit 410 and the selected slave lane circuit 420 (i.e., the slave lane circuit 420 including the selected phase detector) is equivalent to the operation of an analog CDR device. To be more specific, the CP 620 generates a charge/discharge signal according to the output of the selected phase detector, the LPF 630 generates an input voltage according to the charge/discharge signal, and the VCO 640 generates a fourth mode output clock (e.g., a clock including an in-phase clock CM and a quadrature-phase clock CKQ; or a source clock for the generation of clocks including CKI and CKQ while the frequency of the source clock can optionally be different from the frequency of CKI and CKQ) according to the input voltage and outputs the fourth mode output clock to the SL-SC 810 of the selected slave lane circuit 420. When the CDR device 400 operates in the fourth mode, the SL-MUX 850 of the selected slave lane circuit 420 electrically connects the VCO 640 and the SL-SC 810 of the selected slave lane circuit 420 and electrically disconnects the SL-SC 810 of the selected slave lane circuit 420 from the PR 840 of the selected slave lane circuit 420; meanwhile, the operation of each slave lane circuit 420 without including the selected phase detector can be ignored.

When the CDR device 400 operates in the aforementioned fifth mode, the ML-MUX 540 electrically connects the ML-PD 530 and the CP 620, electrically disconnects each SL-PD 820 from the CP 620 and electrically disconnects the PFD 610 from the CP 620; in the meantime, the master lane circuit 410 functions as an analog CDR device. To be more specific, the CP 620 generates a charge/discharge signal according to the output of the ML-PD 530, the LPF 630 generates an input voltage according to the charge/discharge signal, and the VCO 640 generates a fifth mode output clock (e.g., a clock including an in-phase clock CKI and a quadrature-phase clock CKQ; or a source clock for the generation of clocks including CM and CKQ while the frequency of the source clock can optionally be different from the frequency of CKI and CKQ) according to the input voltage and outputs the fifth mode output clock to the PR 840 of each slave lane circuit 420. When the CDR device 400 operates in the fifth mode, each slave lane circuit 420 functions as a digital CDR device, in which the SL-MUX 850 electrically connects the SL-SC 810 and the PR 840 and electrically disconnects the SL-SC 810 from the VCO 640.

It should be noted that the output clock of the VCO 640 can be a single clock while the circuit (e.g., ML-SC 520, PR 840, or SL-MUX 850) receiving the single clock can generate a plurality of clocks having the same frequency but different phases according to the single clock.

To sum up, the present invention can operate in one of multiple modes with a compact configuration. As a result, the present invention is favorable for circuit miniaturization, flexible for usage, and cost-effective.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A clock data recovery (CDR) device capable of operating in one of multiple modes, the CDR device comprising:
   a master lane circuit including:
      a clock multiplication unit including a phase frequency detector, a charge pump, a low pass filter, a voltage-controlled oscillator and a loop divider;
      a master lane sampling circuit coupled to the voltage-controlled oscillator;
      a master lane phase detector coupled to the master lane sampling circuit; and
      a master lane multiplexer coupled between the master lane phase detector and the charge pump, and the master lane multiplexer coupled between the phase frequency detector and the charge pump; and
   a plurality of slave lane circuits, each of the slave lane circuits including:
      a slave lane sampling circuit;
      a slave lane phase detector coupled to the slave lane sampling circuit and the master lane multiplexer;
      a slave lane digital loop filter coupled to the slave lane phase detector;
      a phase rotator coupled to the slave lane digital loop filter and the voltage-controlled oscillator; and
      a slave lane multiplexer coupled between the voltage-controlled oscillator and the slave lane sampling circuit, and the slave lane multiplexer coupled between the phase rotator and the slave lane sampling circuit, wherein the master lane multiplexer and the slave lane multiplexers are configured to have the CDR device operate in one of the multiple modes.

2. The CDR device of claim 1, wherein the multiple modes include a first mode, a second mode, a third mode, a fourth mode and a fifth mode; when the CDR device operates in the first mode, the master lane multiplexer electrically connects the phase frequency detector and the charge pump, and the slave lane multiplexer of each of the slave lane circuits electrically connects the phase rotator and the slave lane sampling circuit; when the CDR device operates in the second mode, the master lane multiplexer electrically connects a first selected phase detector among the slave lane phase detectors and the charge pump, the slave lane multiplexer of the slave lane circuit including the first selected phase detector electrically connects the voltage-controlled oscillator and the slave lane sampling circuit of the slave lane circuit including the first selected phase detector, and the slave lane multiplexer of each of the other slave lane circuit(s) without including the first selected phase detector electrically connects the phase rotator and the slave lane sampling circuit of the same slave lane circuit; when the CDR device operates in the third mode, the master lane multiplexer electrically connects the master lane phase detector and the charge pump; when the CDR device operates in the fourth mode, the mater lane multiplexer electrically connects a second selected phase detector among the slave lane phase detectors and the charge pump, the slave lane multiplexer of the slave lane circuit including the second selected phase detector electrically connects the voltage-controlled oscillator and the slave lane sampling circuit of the slave lane circuit including the second selected phase detector; and when the CDR device operates in the fifth mode, the master lane multiplexer electrically connects the master lane phase detector and the charge pump, and the slave lane multiplexer of each of the slave lane circuits electrically connects the phase rotator and the slave lane sampling circuit of the same slave lane circuit.

3. The CDR device of claim 2, wherein the first mode is a digital CDR mode applicable to High Definition Multimedia Interface (HDMI) protocol, the second mode is a hybrid CDR mode applicable to HDMI protocol, the third mode is an analog CDR mode applicable to a master lane of DisplayPort protocol, the fourth mode is another analog CDR mode applicable a slave lane of DisplayPort protocol and the fifth mode is another hybrid CDR mode applicable to two or four lanes of DisplayPort protocol.

4. The CDR device of claim 2, wherein when the CDR device operates in the first mode, the master lane multiplexer electrically disconnects the master lane phase detector from the charge pump and electrically disconnects the slave lane phase detector of each of the slave lane circuits from the charge pump.

5. The CDR device of claim 2, wherein when the CDR device operates in the first mode, the slave lane multiplexer of each of the slave lane circuits electrically disconnects the voltage-controlled oscillator from the slave lane sampling circuit.

6. The CDR device of claim 2, wherein when the CDR device operates in the second mode, the master lane multiplexer electrically disconnects the slave lane phase detector of each of the slave lane circuit(s) without including the first selected phase detector from the charge pump, electrically disconnects the phase frequency detector from the charge pump, and electrically disconnects the master lane phase detector from the charge pump.

7. The CDR device of claim 2, wherein when the CDR device operates in the second mode, the slave lane multiplexer of the slave lane circuit including the first selected phase detector electrically disconnects the phase rotator of the slave lane circuit including the first selected phase detector from the slave lane sampling circuit of the slave lane circuit including the first selected phase detector, and the slave lane multiplexer of each of the slave lane circuit(s) without including the first selected phase detector electrically connects the phase rotator and the slave lane sampling circuit of the same slave lane circuit and electrically disconnects the voltage-controlled oscillator from the slave lane sampling circuit.

8. The CDR device of claim 2, wherein when the CDR device operates in the third mode, the master lane multiplexer electrically disconnects the slave lane phase detector of each of the slave lane circuits from the charge pump and electrically disconnects the phase frequency detector from the charge pump.

9. The CDR device of claim 2, wherein when the CDR device operates in the fourth mode, the master lane multiplexer electrically disconnects the slave lane phase detector of each of the slave lane circuit(s) without including the second selected phase detector from the charge pump, electrically disconnects the master lane phase detector from the charge pump and electrically disconnects the phase frequency detector from the charge pump.

10. The CDR device of claim 2, wherein when the CDR device operates in the fourth mode, the slave lane multiplexer of the slave lane circuit including the second selected phase detector electrically disconnects the phase rotator of the slave lane circuit including the second selected phase detector from the slave lane sampling circuit of the slave lane circuit including the second selected phase detector.

11. The CDR device of claim 2, wherein when the CDR device operates in the fifth mode, the master lane multiplexer electrically disconnects the slave lane phase detector from the charge pump and electrically disconnects the phase frequency detector from the charge pump, and the slave lane multiplexer of each of the slave lane circuits electrically disconnects the voltage-controlled oscillator from the slave lane sampling circuit.

12. The CDR device of claim 1, wherein the phase frequency detector is coupled to a master lane signal input terminal to receive a clock signal.

13. The CDR device of claim 1, wherein the voltage-controlled oscillator outputs two clocks having the same frequency and having a phase difference of 90 degrees.

14. The CDR device of claim 1, wherein the voltage-controlled oscillator outputs a source clock that is used for generating two clocks having the same frequency and having a phase difference of 90 degrees.

15. The CDR device of claim 1, wherein the master lane sampling circuit includes a master lane data sampler and a master lane edge sampler, the master lane data sampler and the master lane edge sampler are configured to execute sample operation according to at least one output clock of the voltage-controlled oscillator, and each of the slave lane sampling circuits includes a slave lane data sampler and a slave lane edge sampler which are configured to execute sample operation according at least one output clock from the slave lane multiplexer of the slave lane circuit including the slave lane data sampler and the slave lane edge sampler.

16. The CDR device of claim 1, wherein when the CDR device operates in a first mode of the multiple modes, the master lane multiplexer electrically connects the phase frequency detector and the charge pump, electrically disconnects the master lane phase detector from the charge pump and electrically disconnects the slave lane phase detector of each of the slave lane circuits from the charge pump, and the slave lane multiplexer of each of the slave lane circuits electrically connects the phase rotator and the slave lane sampling circuit and electrically disconnects the voltage-controlled oscillator from the slave lane sampling circuit.

17. The CDR device of claim 1, wherein when the CDR device operates in a second mode of the multiple modes, the master lane multiplexer electrically connects a selected phase detector among the slave lane phase detectors of the slave lane circuits and the charge pump, electrically disconnects the slave lane phase detector of each of the slave lane circuit(s) without including the selected phase detector from the charge pump, electrically disconnects the phase frequency detector from the charge pump and electrically disconnects the master lane phase detector from the charge pump, and the slave lane multiplexer of the slave lane circuit including the selected phase detector electrically connects the voltage-controlled oscillator and the slave lane sampling circuit of the slave lane circuit including the selected phase detector and electrically disconnects the phase rotator of the slave lane circuit including the selected phase detector from the slave lane sampling circuit of the slave lane circuit including the selected phase detector, and the slave lane multiplexer of each of the slave lane circuit(s) without including the selected phase detector electrically connects the phase rotator and the slave lane sampling circuit of the same slave lane circuit and electrically disconnects the voltage-controlled oscillator from the slave lane sampling circuit.

18. The CDR device of claim 1, wherein when the CDR device operates in a third mode of the multiple modes, the master lane multiplexer electrically connects the master lane phase detector and the charge pump, electrically disconnects the slave lane phase detector of each of the slave lane circuits from the charge pump and electrically disconnects the phase frequency detector from the charge pump.

19. The CDR device of claim 1, wherein when the CDR device operates in a fourth mode of the multiple modes, the master lane multiplexer electrically connects a selected phase detector among the slave lane phase detectors of the slave lane circuits and the charge pump, electrically disconnects the slave lane phase detector of each of the slave lane circuit(s) without including the selected phase detector from the charge pump, electrically disconnects the master lane phase detector from the charge pump and electrically disconnects the phase frequency detector from the charge pump, and the slave lane multiplexer of the slave lane circuit including the selected phase detector electrically connects the voltage-controlled oscillator and the slave lane sampling circuit of the slave lane circuit including the selected phase detector and electrically disconnects the phase rotator of the slave lane circuit including the selected phase detector from the slave lane sampling circuit of the slave lane circuit including the selected phase detector.

20. The CDR device of claim 1, wherein when the CDR device operates in a fifth mode of the multiple modes, the master lane multiplexer electrically connects the master lane phase detector and the charge pump, electrically disconnects the slave lane phase detector of each of the slave lane circuits from the charge pump and electrically disconnects the phase frequency detector from the charge pump, and the slave lane multiplexer of each of the slave lane circuits electrically connects the phase rotator and the slave lane sampling circuit of the same slave lane circuit and electrically disconnects the voltage-controlled oscillator from the slave lane sampling circuit.

* * * * *